United States Patent [19]

Hattori et al.

[11] Patent Number: 4,520,458
[45] Date of Patent: May 28, 1985

[54] APPARATUS FOR CONTROLLING WRITING OF DATA INTO A MEMORY HAVING DIFFERENT READ AND WRITE TIMES

[75] Inventors: Seiichi Hattori, Hachioji; Kunio Kanda, Kunitachi, both of Japan

[73] Assignee: Fanuc Ltd, Minamitsuru, Japan

[21] Appl. No.: 486,892

[22] Filed: Apr. 20, 1983

[30] Foreign Application Priority Data

Apr. 22, 1982 [JP] Japan .................................. 57-67720

[51] Int. Cl.³ .............................................. G06F 11/00
[52] U.S. Cl. ................................................... 364/900
[58] Field of Search ............................. 364/200, 900

[56] References Cited

U.S. PATENT DOCUMENTS 4,092,728 5/1978 Baltzer ................................ 364/900
4,388,695 6/1983 Heinemann ......................... 364/900

*Primary Examiner*—Gareth D. Shaw
*Assistant Examiner*—Jameson Lee
*Attorney, Agent, or Firm*—Staas & Halsey

[57] ABSTRACT

An apparatus for controlling the writing of data from a processor into a memory having different read and write times, wherein the memory is connected directly to the processor through address and data buses without the use of an input/output port. A timer circuit is connected to the buses and memory and is controlled by the processor to produce a write timing signal which controls the writing of data into the memory. The processor is placed in a holding state, based on the write timing signal, for a period long enough to assure that the data will be written into the memory in its entirety.

3 Claims, 2 Drawing Figures

APPARATUS FOR CONTROLLING WRITING OF DATA INTO A MEMORY HAVING DIFFERENT READ AND WRITE TIMES

BACKGROUND OF THE INVENTION

This invention relates to improvements in an apparatus for controlling the writing of data into a memory by means of a processor, which memory has different read and write access times.

A computer includes a processor for executing processing, a memory for storing the data necessary for processing, and address and data buses for interconnecting the processor and memory. Examples of memories are random-access memories and read-only memories. A memory which can be connected directly to the data and address bus lines is limited to one having identical read and write access times. A memory which does not have this feature generally is connected to the data and address buses through an input/output port. The reason is that the read and write times of the memory cannot be altered by the processor itself, due to the fixed processing cycle of the processor.

An example of a memory having different read and write times is an electrically erasable programmable ROM (EEPROM). An EEPROM is a read-only memory device which can be electrically erased and reprogrammed and, unlike a RAM, has the advantage of being able to preserve stored information without being constantly supplied with electrical power. An advantage over an ordinary ROM, moreover, is that stored information can be altered. An EEPROM is therefore used in the form of a memory cassette for storing predetermined data or programs. To execute prescribed data processing, the memory cassette is loaded into the computer frame housing the processor, for the purpose of supplying the processor or computer RAM with the stored data or program that is required. An EEPROM has widely divergent access times ranging from a short 450 nS for reading to a long 20 mS for writing, and must therefore be connected to the processor through an input/output port. However, due to the connection effected through the buffer means of the input/output port, an inordinately long period of time is required to read data out of the memory.

SUMMARY OF THE INVENTION

Accordingly, an object of the present invention is to provide an apparatus for controlling the writing of data into a memory, wherein a memory having different read and write times may be connected to a processor directly through bus lines to shorten the time required for reading, thereby making it possible to reduce processing time.

Another object of the present invention is to provide a simple and inexpensive apparatus for controlling the writing of data into a memory, wherein a processor is placed in a holding state for the duration of a write timing signal applied to a memory having a long write access time, whereby the data to be written into the memory is held on a data bus long enough for the write operation to be completed in order to assure that all the data will be written.

According to the present invention, the foregoing objects are attained by providing an apparatus for controlling the writing of data into a memory having different read and write times, wherein the memory is connected directly to the processor through address and data buses, without the use of an input/output port. Connected to the buses is a timer circuit controlled by the processor to produce a write timing signal which controls the writing of data into the memory. A standby control circuit is controlled by the timer circuit to place the processor in a holding state based on the write timing signal for a period long enough to assure that the data will be written from the processor into the memory in its entirety.

Other features and advantages of the present invention will be apparent from the following description taken in conjunction with the accompanying drawings.

DESCRIPTION OF THE PREFERRED EMBODIMENT

Figure 1:
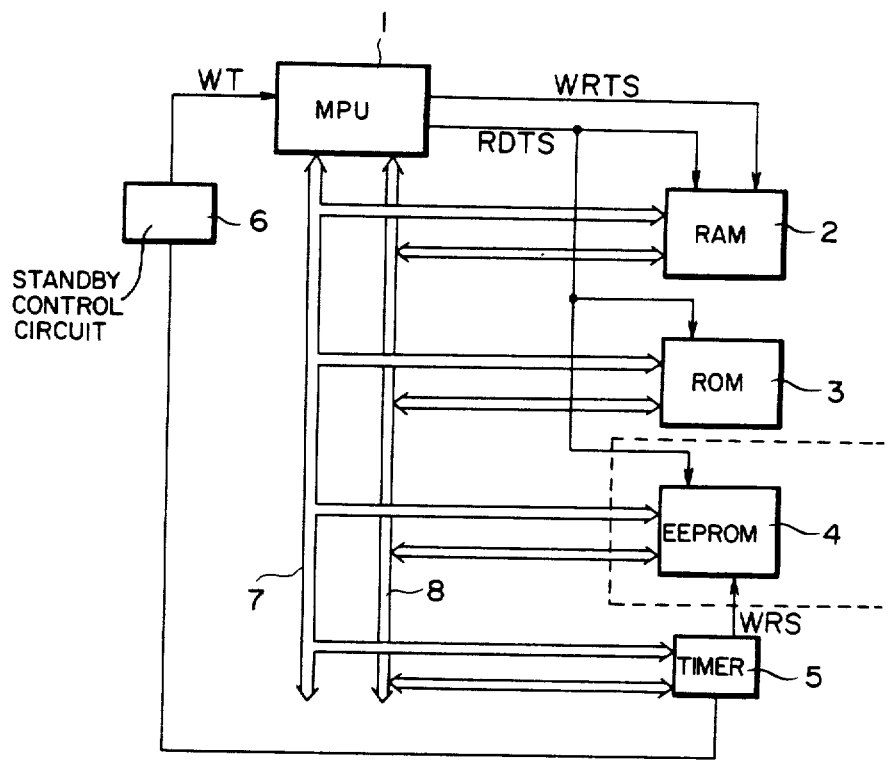
FIG. 1 is a block diagram illustrating an embodiment of a control apparatus according to the present invention.

Referring to FIG. 1, the apparatus of the present invention includes a microprocessor (MPU) 1 for executing data processing in accordance with a predetermined processing cycle, and for producing a read timing signal RDTS when a memory is to be read, and a write timing signal WRTS when the memory is to be written. A random-access memory (RAM) 2 is used for storing, e.g., data processed by the MPU 1. A read-only memory ROM 3 stores fixed data and the control program for the MPU 1. The RAM 2 and ROM 3 receive the read timing signal RDTS from the MPU 1 and are addressed by signals arriving from the MPU 1 on an address bus 7, and respond by delivering the designated data to the MPU 1 on a data bus 8. The RAM 2 receives the write timing signal WRTS from the MPU 1 and is capable of receiving data via the data bus 8. An EEPROM 4 is utilized in the form of a memory cassette having a connector, not shown, which is fit into a connector of the housing accommodating the MPU 1, RAM 2 and ROM 3. The EEPROM 4 is connected directly to the address and data buses 7, 8, as shown, and receives the read timing signal RDTS from the MPU 1. The apparatus of the invention includes a timer circuit 5 connected to the address and data buses 7, 8. The timer circuit 5 receives a timer start command from the MPU 1 via the data bus 8, generates a write timing signal WRS applied to the EEPROM 4, and controls a standby control circuit 6. The latter is responsive to the timer circuit 5 to generate a wait signal WT for placing the MPU 1 in a holding state. The address bus 7 transmits address signals from the MPU 1 to the RAM 2, ROM 3, EEPROM 4 and timer circuit 5. The data bus 8 is for the exchange of data between the MPU 1 and the RAM 2, ROM 3, EEPROM 4 and timer circuit 5.

The control apparatus having the foregoing construction operates in the following manner. For reading data, the MPU 1 delivers, on the address bus 7, the address of a location at which a required item of data is stored, and generates the read timing signal RDTS. In response, the data is read from the corresponding address of the RAM 2, ROM 3 or EEPROM 4 and is transmitted to the MPU 1 via the data bus 8 so that the MPU 1 may execute the prescribed processing using this data. The read timing signal RDTS is set in accordance with the access time of each memory.

Figure 2:
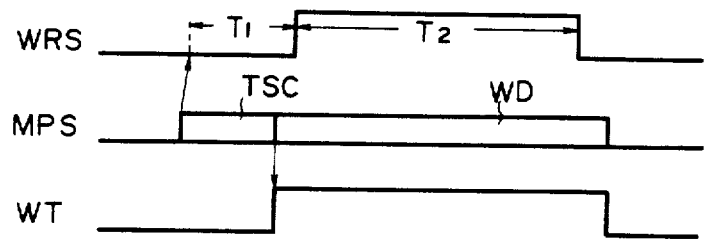
FIG. 2 is a timing chart for describing the operation of the apparatus shown in FIG. 1.

For writing data, the MPU 1 delivers a write address on the address bus 7, supplies the data to be written via data bus 8, and applies the write timing signal WRTS to the RAM 2. Since the access time for writing data into the RAM 2 is substantially the same as the access time for reading out of the RAM, the MPU 1 can generate the write timing signal WRTS without requiring any alteration of its own processing cycle, thereby allowing the data to be written into the RAM 2 without difficulty. In the case of the EEPROM 4, however, the access time for writing is longer than that for reading, as mentioned above. The write timing signal WRTS generated by the MPU 1 will therefore be too short, making it impossible to write data into the EEPROM. Accordingly, it is necessary to generate a write timing signal commensurate with the access time of the EEPROM 4, and to hold the data and address signals from the MPU 1 on the buses accordingly. The first step in writing data into the EEPROM 4, therefore, is to start the timer circuit 5. More specifically, as shown in FIG. 2, the MPU 1 sends an address to the timer circuit 5 via the address bus 7, and sends a timer start command TSC to the timer circuit via the data bus 8 to set the timer circuit 5 into operation. Upon passage of a length of time T1 measured from the start of operation, the timer circuit 5 generates a write timing signal WRS of duration T2. The time period T1 is the time required to supply the EEPROM 4 with the write address and write data following the timer start command TSC. The time period T2 is set to the access time for the writing of data into the EEPROM 4. After generating the timer start command TSC, the MPU 1 in its next processing cycle supplies the EEPROM 4 with the write address and write data WD via the address and data buses 7, 8, respectively. As a result, the data WD is written into the EEPROM 4 at the designated address thereof on the basis of the write timing signal WRS. In other words, the data is written into the EEPROM 4 in accordance with its own write time. Further, the timer circuit 5 enables the standby control circuit 6 in synchronization with the trailing edge of the timer start command TSC, and the standby control circuit 6 responds by generating the wait signal WT. This places the MPU 1 in a holding state after it has delivered the write address and write data to the EEPROM 4, and has the effect of holding the write address and data on the buses 7, 8. More specifically, the MPU 1 is prohibited by the signal WT from starting the next processing cycle, so that the current write cycle for the delivery of the above-mentioned write address and write data is maintained. This might be accomplished, for example, by having the wait signal WT initiate a control operation which prevents the MPU process clock from being applied to the MPU step counter (not shown). When the timer circuit 5 terminates the output of the write timing signal WRS, a disable signal is applied to the standby control circuit 6, whereby the wait signal WT is disabled to permit the MPU 1 to execute the next processing cycle.

In accordance with the present invention as described and illustrated hereinabove, the timer circuit 5 is provided and responds to the timer start command TSC from the processor MPU 1 by generating the write timing signal WRS. The write timing signal WRS has a duration which is set to the write time of the EEPROM 4 (or any memory having different read and write times) to allow the required data to be written into the EEPROM 4. Such an arrangement permits the EEPROM 4 to be connected directly to the processor MPU 1 via the buses 7, 8, thereby shortening the time required for reading data from the EEPROM and providing other advantages which result from such a direct connection. Further, according to the invention, the processor MPU 1 is placed in a holding state, in which it is not permitted to execute the next processing step, for the duration of the write timing signal WRS. As a consequence, the data to be written into the EEPROM is held on the data bus long enough for the write operation to be completed, so that no buffer memory is required for the operation to be achieved. In addition, since these effects can be obtained by providing the timer circuit 5, the above-described direct connection can be accomplished inexpensively and simply without complicating the overall apparatus.

As many apparently widely different embodiments of the present invention can be made without departing from the spirit and scope thereof, it is to be understood that the invention is not limited to the specific embodiments thereof except as defined in the appended claims.

What we claim is:

1. An apparatus for controlling the writing of data from a processor into a memory having different read and write times, and connected directly to the processor by address and data buses, the processor generating a timer start command signal when data is to be written into the memory in a current write cycle, comprising:

a timer circuit connected to the memory and to the address and data buses, said timer circuit responsive to the timer start command signal received from the processor via the data bus, for generating a write timing signal which is applied to the memory, and for generating an enable signal, said write timing signal having a duration commensurate with the write time of the memory, so that data from the processor is written into the memory via the data bus within the write time of the memory; and a standby control circuit connected to the processor and to said timer circuit, said standby control circuit responsive to the enable signal from said timer circuit to generate a wait signal for holding the processor in the current write processing cycle long enough for the data from the processor to be written into the memory.

2. The apparatus according to claim 1, wherein said timer circuit supplies said standby control circuit with a disable signal when the writing of the data into the memory is completed, said standby control circuit responding by terminating the wait signal to free the processor for execution of a subsequent processing cycle.

3. An apparatus for controlling writing of data from a processor into a memory having different read and write times, the processor providing a timer start command signal and address memory at which the data is to be written during a current write processing cycle, comprising:

an address bus, directly connected to the processor and the memory, for providing the address at which the data is to be written into the memory;

a data bus, directly connected the processor and the memory, for providing the timer start command signal and the data which is to be written into the memory;

a timer circuit, connected to the memory, said address bus and said data bus, for sending a write timing signal to the memory in response to the timer start command signal and for generating an enable signal, said write timing signal having a duration which is at least as long as the write time of the memory, so that the data provided by the processor on said data bus is written into the memory within the write time; and a standby control circuit, connected to the processor and said timer circuit, for providing a wait signal to the processor in response to the enable signal generated by said timer circuit, the wait signal holding the processor in the current write processing cycle until the data provided on the data bus by the processor is written into the memory, said standby control circuit ceasing generation of the wait signal when said timer circuit stops generating the enable signal, so that the processor is allowed to execute the next write processing cycle.

* * * * *

UNITED STATES PATENT AND TRADEMARK OFFICE
CERTIFICATE OF CORRECTION

PATENT NO. :   4,520,458
DATED      :   MAY 28, 1985
INVENTOR(S):   SEIICHI HATTORI ET AL.

It is certified that error appears in the above-identified patent and that said Letters Patent is hereby corrected as shown below:

Col. 4, line 54, "address memory" should be --memory address--.

Signed and Sealed this

Seventeenth Day of September 1985

[SEAL]

Attest:

DONALD J. QUIGG

Attesting Officer

Commissioner of Patents and
Trademarks—Designate